US009881938B2

(12) United States Patent
Kamimura et al.

(10) Patent No.: US 9,881,938 B2
(45) Date of Patent: Jan. 30, 2018

(54) SUBSTRATE FOR DISPLAY DEVICE AND METHOD FOR MANUFACTURING DISPLAY DEVICE

(71) Applicant: Japan Display Inc., Minato-ku (JP)

(72) Inventors: Takaaki Kamimura, Tokyo (JP); Noriyuki Hirata, Tokyo (JP)

(73) Assignee: Japan Display Inc., Minato-ku (JP)

( * ) Notice: Subject to any disclaimer, the term of this patent is extended or adjusted under 35 U.S.C. 154(b) by 31 days.

(21) Appl. No.: 14/688,339

(22) Filed: Apr. 16, 2015

(65) Prior Publication Data

US 2015/0303220 A1 Oct. 22, 2015

(30) Foreign Application Priority Data

Apr. 18, 2014 (JP) ................................ 2014-086351

(51) Int. Cl.
| | |
|---|---|
| H01L 27/12 | (2006.01) |
| H01L 29/66 | (2006.01) |
| H01L 21/3213 | (2006.01) |
| H01L 21/02 | (2006.01) |
| H01L 21/311 | (2006.01) |

(52) U.S. Cl.
CPC .... *H01L 27/1218* (2013.01); *H01L 21/02063* (2013.01); *H01L 21/31111* (2013.01); *H01L 21/32134* (2013.01); *H01L 27/1259* (2013.01); *H01L 29/66757* (2013.01)

(58) Field of Classification Search
CPC .................................................. H01L 27/1218
See application file for complete search history.

(56) References Cited

U.S. PATENT DOCUMENTS

| | | | |
|---|---|---|---|
| 2003/0057183 A1 | 3/2003 | Cho et al. | |
| 2007/0284627 A1* | 12/2007 | Kimura | G02F 1/134363 257/257 |
| 2010/0065952 A1* | 3/2010 | Oikawa | H01L 27/1214 257/679 |

FOREIGN PATENT DOCUMENTS

| | | |
|---|---|---|
| CN | 1979229 A | 6/2007 |
| CN | 101075051 A | 11/2007 |
| CN | 101093306 A | 12/2007 |
| CN | 101145567 A | 3/2008 |
| CN | 102822734 A | 12/2012 |
| CN | 203084389 U | 7/2013 |
| JP | 07-146490 | 6/1995 |
| JP | 08-330594 | 12/1996 |

(Continued)

OTHER PUBLICATIONS

Combined Office Action and Search Report dated Jun. 21, 2017 in Chinese Patent Application No. 201510184382.2 (with English language translation).

*Primary Examiner* — Moazzam Hossain
*Assistant Examiner* — Hajar Kolahdouzan
(74) *Attorney, Agent, or Firm* — Oblon, McClelland, Maier & Neustadt, L.L.P.

(57) ABSTRACT

According to one embodiment, a substrate for display device includes an insulating substrate and a conductive film formed on at least one main surface of the insulating substrate. As to the substrate in an etching process in which a fluoric acid solution containing 10% or more hydrogen fluoride is used, a first etching rate of the conductive film is substantially the same as a second etching rate of the insulating substrate, or the first etching rate is greater than the second etching rate.

9 Claims, 7 Drawing Sheets

(56) References Cited

FOREIGN PATENT DOCUMENTS

| | | |
|---|---|---|
| JP | 10-275775 | 10/1998 |
| JP | 2013-007767 | 1/2013 |

\* cited by examiner

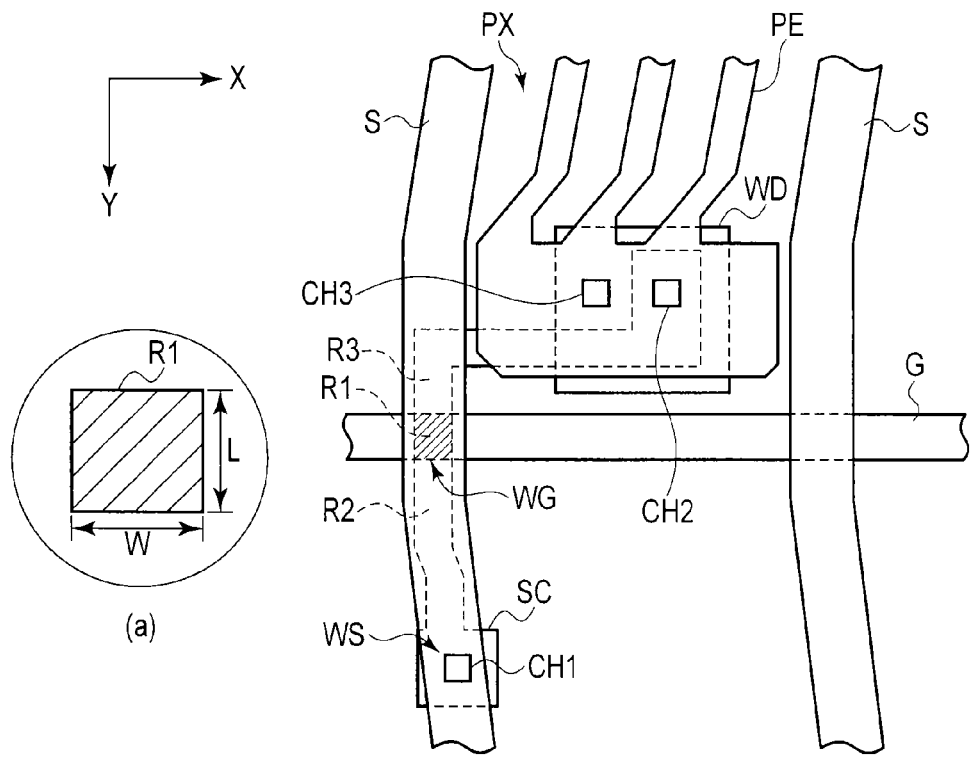
F I G. 2
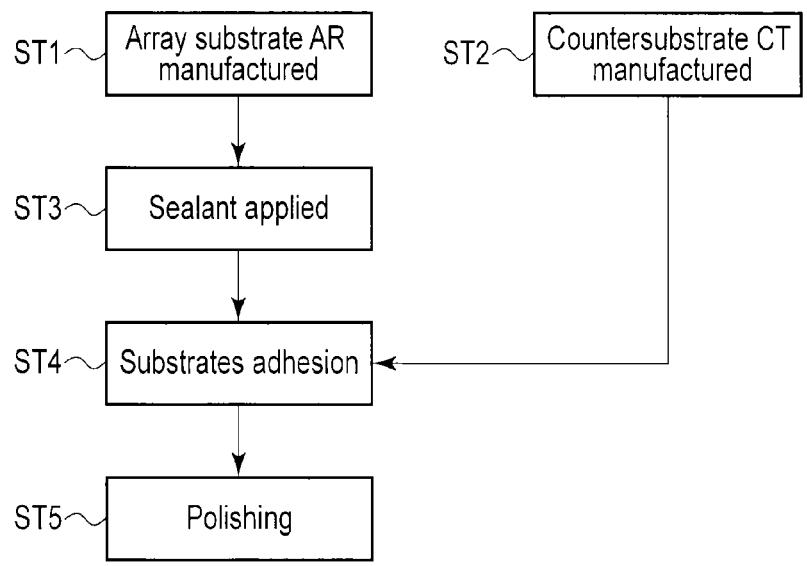
F I G. 3

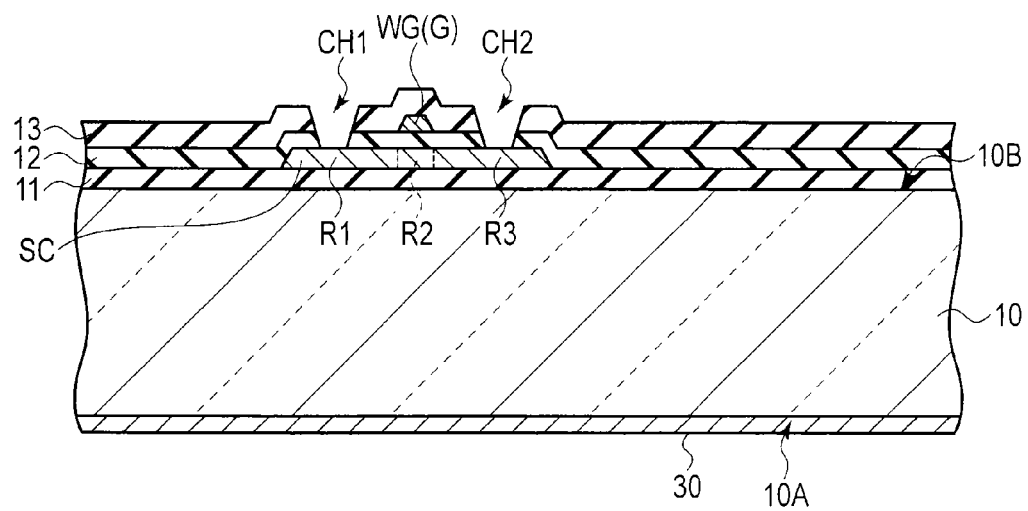
F I G. 7
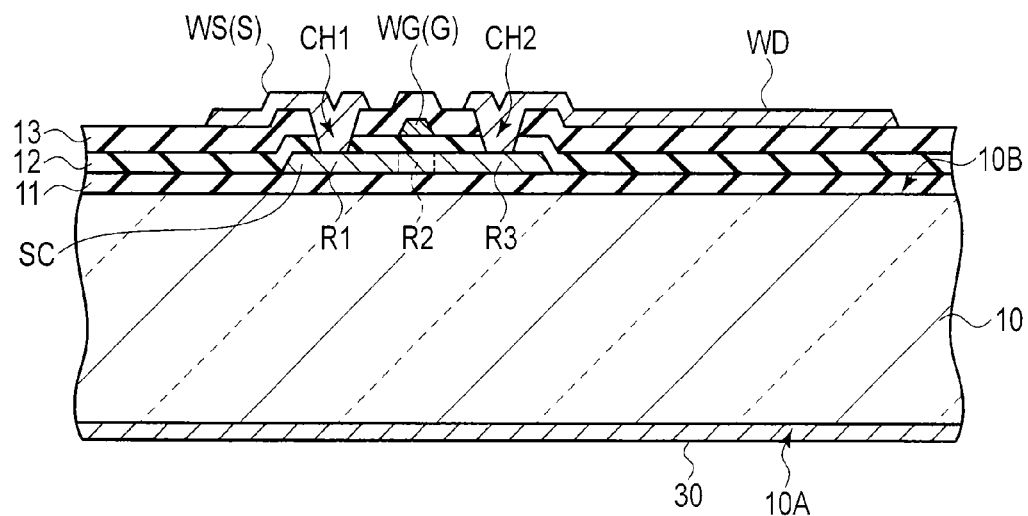
F I G. 8

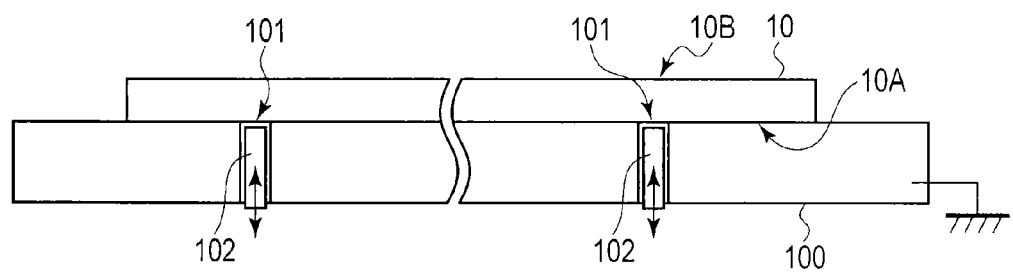
F I G. 11
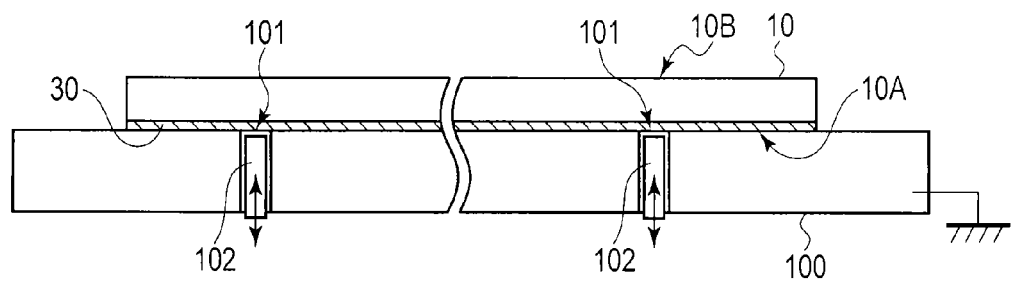
F I G. 12

SUBSTRATE FOR DISPLAY DEVICE AND METHOD FOR MANUFACTURING DISPLAY DEVICE

CROSS-REFERENCE TO RELATED APPLICATIONS

This application is based upon and claims the benefit of priority from Japanese Patent Application No. 2014-086351, filed Apr. 18, 2014, the entire contents of which are incorporated herein by reference.

FIELD

Embodiments described herein relate generally to a substrate for display device and method for manufacturing a display device.

BACKGROUND

Display devices such as a liquid crystal display device and an organic electroluminescent (EL) display device include various components on an insulating substrate, such as gate lines and source lines used for driving pixels, and switching elements. During the manufacturing process of such a display device, the insulating substrate, lines and electrodes in the electrically floating state tend to become electrostatically charged by, for example, contact, friction, and exfoliation between the insulating substrate and various manufacturing apparatuses and conveying mechanisms or by a plasma treatment such as plasma chemical vapor deposition (CVD) and plasma etching. The electrostatic energy may sometimes cause electrostatic discharge (ESD) during the manufacturing process which damages the components having capacitance such as switching elements. Hereinafter, such a phenomenon is referred to as electrostatic destruction.

Due to a strong demand for high-definition display devices, miniaturization of switching elements and lines is in progress. A miniaturized switching element has a small capacitance which easily leads to electrostatic destruction. This must be dealt with for increased productivity.

BRIEF DESCRIPTION OF THE DRAWINGS

FIG. 2 is a plan view which schematically shows a pixel shown in FIG. 1.

FIG. 3 is a flowchart which schematically shows the manufacturing processes of the liquid crystal display device.

FIG. 7 is a cross-sectional view which shows a manufacturing process of the array substrate.

FIG. 8 is a cross-sectional view which shows a manufacturing process of the array substrate.

FIG. 11 shows a basic principle of unevenness in film thickness.

FIG. 12 shows a basic principle of suppression of the unevenness in film thickness in the embodiment.

DETAILED DESCRIPTION

Figure 1:
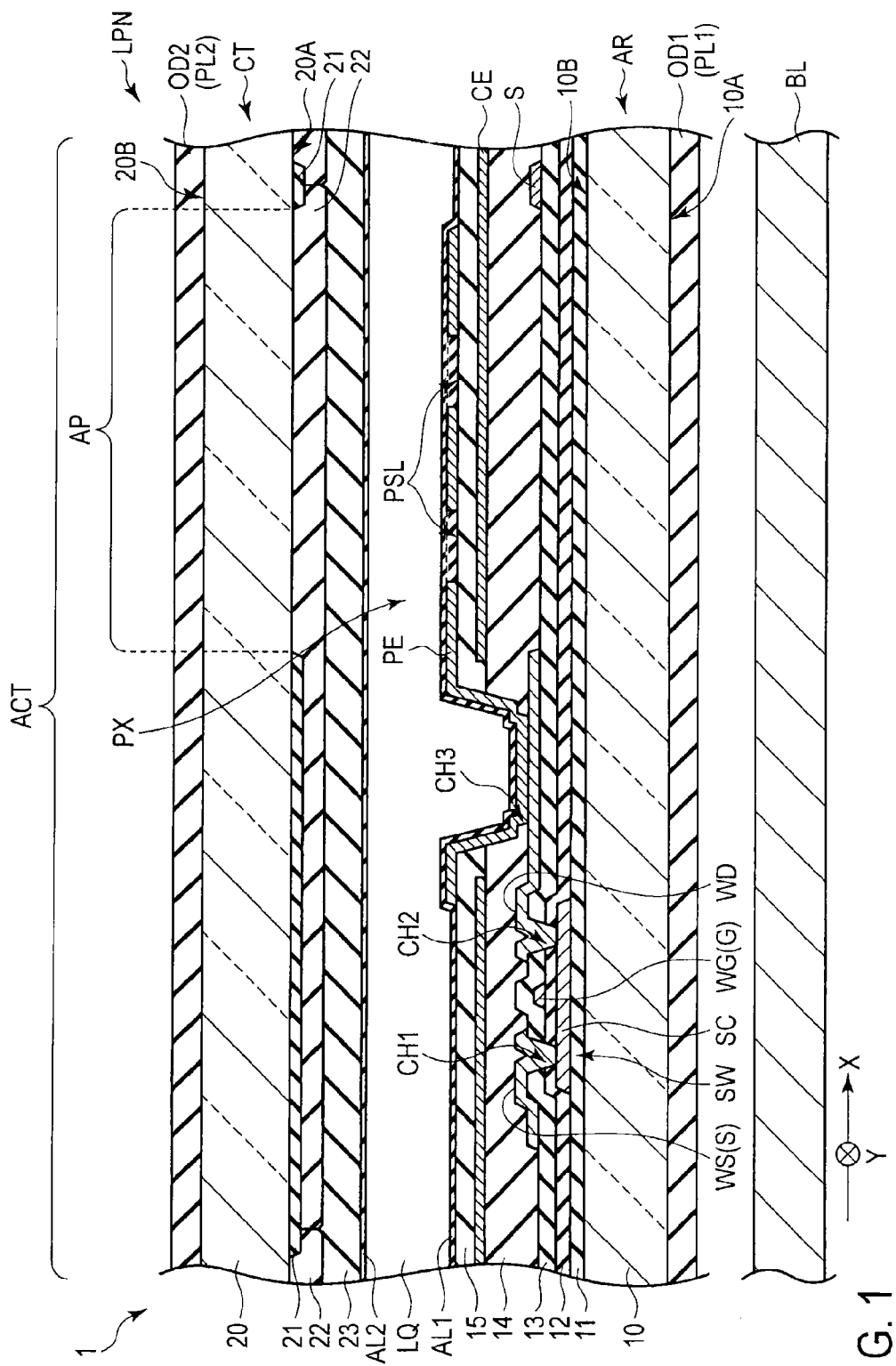
FIG. 1 is a cross-sectional view which shows a part of the structure of a liquid crystal display device of an embodiment.

In general, according to one embodiment, a substrate for display device includes an insulating substrate and a conductive film. The conductive film is formed on at least one main surface of the insulating substrate. As to the substrate in an etching process in which a fluoric acid solution containing 10% or more hydrogen fluoride is used, a first etching rate of the conductive film is substantially the same as a second etching rate of the insulating substrate, or the first etching rate is greater than the second etching rate.

According to another embodiment, a substrate for display device includes an insulating substrate of an array substrate and a conductive film. The conductive film is formed of a nitride and formed on at least one main surface of the insulating substrate.

According to an embodiment, a manufacturing method of a display device includes forming switching elements above a second main surface of an insulating substrate having a first main surface on which a conductive film is formed, and eroding the conductive film formed on the first main surface of the insulating substrate on which the switching elements are formed.

According to another embodiment, a manufacturing method of a display device includes forming switching elements above a second main surface of an insulating substrate, the insulating substrate having a first main surface on which a conductive film formed of a nitride is formed. The forming of the switching elements includes forming a semiconductor layer above the second main surface of the insulating substrate and a first electrode opposed to the semiconductor layer with an insulating film interposed therebetween, and forming a second electrode and a third electrode electrically connected to a second region and a third region of the semiconductor layer, respectively, between which a first region of the semiconductor layer opposed to the first electrode is disposed.

An embodiment will be explained with reference to accompanying drawings.

Note that the disclosure is presented for the sake of exemplification, and any modification and variation conceived within the scope and spirit of the invention by a person having ordinary skill in the art are naturally encompassed in the scope of invention of the present application. Furthermore, a width, thickness, shape, and the like of each element are depicted schematically in the Figures as compared to actual embodiments for the sake of simpler explanation, and they are not to limit the interpretation of the invention of the present application. Furthermore, in the description and Figures of the present application, structural elements having the same or similar functions will be referred to by the same reference numbers and detailed explanations of them that are considered redundant may be omitted.

In this embodiment, a display device is a liquid crystal display device. However, no limitation is intended thereby, and the display device may be any type of flat panel display devices including self-luminous display device such as an organic electroluminescent display device and the like, and electronic paper display device including electrophoretic elements and the like. Furthermore, the display device of the present embodiment can be used in various devices such as smartphone, tablet, mobile phone, notebook computer, game console, and car equipment.

FIG. 1 is a cross-sectional view which shows the structure of a liquid crystal display device 1 of the present embodiment in part. The liquid crystal display device 1 includes, for example, a transparent liquid crystal display panel LPN of active matrix type and a backlight BL. The liquid display panel LPN includes an active area ACT which displays an image. The active area ACT includes a plurality of pixels PX arranged in a matrix. FIG. 1 shows a structure corresponding to a single pixel PX.

The liquid crystal display panel LPN includes an array substrate AR, countersubstrate CT disposed to be opposed to the array substrate AR, and liquid crystal layer LQ held between the array substrate AR and the countersubstrate CT. The array substrate AR includes a light transmissive first insulating substrate 10. In the present embodiment, the first insulating substrate 10 is a glass substrate. Note that, in stead of such a glass substrate, the first insulating substrate 10 may be formed of other insulating substrate materials such as resin. The backlight BL is disposed the rear surface side of the array substrate AR. As the backlight BL, various types of light sources such as light-emitting diodes (LEDs) can be used.

In the present embodiment, the surface (outer surface) of the first insulating substrate 10 which is opposed to the backlight BL is a first main surface 10A and the surface (inner surface) of the first insulating substrate 10 which is opposed to the countersubstrate CT is a second main surface 10B. Furthermore, a direction parallel to the first main surface 10A and the second main surface 10B is defined as direction X and a direction orthogonal to direction X is defined as direction Y.

The array substrate AR of the liquid crystal display panel LPN in the figure includes a pixel electrode PE and a common electrode CE. In the liquid crystal display panel LPN with this structure, liquid crystal molecules in the liquid crystal layer LQ are switched using a field formed between the pixel electrode PE and the common electrode CE.

The array substrate AR includes, at the second main surface 10B side, an undercoat layer 11, first insulating film 12, second insulating film 13, third insulating film 14, fourth insulating film 15, switching element SW, pixel electrode PE, common electrode CE, and first alignment film AL1.

The second main surface 10B of the first insulating substrate 10 is covered with the undercoat layer 11. The undercoat layer 11 is formed of silicon oxide (SiO), or silicon oxynitride (SiON), or the like.

The semiconductor layer SC of the switching element SW is disposed on the undercoat layer 11. The semiconductor layer SC is formed of, for example, polycrystalline silicon (p-Si). Note that the semiconductor layer SC may be formed of other materials such as amorphous silicon (a-Si) and oxide semiconductor. The undercoat layer 11 may be omitted, and the semiconductor layer SC may be directly disposed on the first insulating substrate 10.

The semiconductor layer SC is covered with the first insulating film 12. Furthermore, the first insulating film 12 is disposed on the undercoat layer 11. The switching element SW includes a first electrode WG which is formed on the first insulating film 12 above the semiconductor layer SC. The first electrode WG may be referred to as gate electrode.

The first electrode WG is formed integrally with a gate line G, for example, and covered with the second insulating film 13. Furthermore, the second insulating film 13 is disposed above the first insulating film 12. For example, the first electrode WG (gate line G) is formed of MoW. The first electrode WG is formed of a metal material such as molybdenum, tungsten, aluminum, titanium, and copper, or an alloy containing such a metal material. The first insulating film 12 and the second insulating film 13 are formed of, for example, silicon oxide (SiO), silicon nitride (SiNx), and the like.

The switching element SW includes a second electrode WS and a third electrode WD formed on the second insulating film 13. The second electrode WS may be referred to as a source electrode. The third electrode WD may be referred to as a drain electrode. The second electrode WS is formed integrally with a source line, for example. The second electrode WS (source line S) and the third electrode WD are formed of the same material used for the first electrode WG. The second electrode WS and the third electrode WD are electrically connected to the semiconductor layer SC through a first contact hole CH1 and a second contact hole CH2 passing through the first insulating film 12 and the second insulating film 13, respectively. As an example of the switching element SW, a thin-film transistor of single-gate or top-gate type in FIG. 1 is possible. The thin-film transistor of top-gate type is suitable since the parasitic capacitance can be further reduced as compared to a thin-film transistor of bottom-gate type.

The switching element SW is covered with the third insulating film 14. The third insulating film 14 is disposed on the second insulating film 13. The third insulating film 14 is formed of, for example, a transparent resin material.

The common electrode CE is formed on the third insulating film 14. The common electrode CE is formed of a transparent conductive material such as indium tin oxide (ITO) and indium zinc oxide (IZO). The fourth insulating film 15 is disposed on the common electrode CE. The fourth insulating film 15 is also disposed on the third insulating film 14. The fourth insulating film 15 is formed of, for example, silicon nitride (SiNx).

A third contact hole CH3 is formed passing through both the third insulating film 14 and the fourth insulating film 15 to reach the third electrode WD. The common electrode CE does not extend to reach the third contact hole CH3.

The pixel electrode PE is formed on the fourth insulating film 15 and opposed to the common electrode CE. The pixel electrode PE is electrically connected to the third electrode WD of the switching element SW through the third contact hole CH3. Furthermore, the pixel electrode PE is composed of linear electrodes having at least one slit PSL; however, no limitation is intended thereby, and the pixel electrode PE may be formed of a single linear electrode without a slit PSL. The pixel electrode PE is formed of a transparent conductive material such as ITO and IZO.

The pixel electrode PE is covered with the first alignment film AL1. Furthermore, the first alignment film AL1 covers the fourth insulating film 15, too. The first alignment film AL1 is formed of a material indicative of horizontal alignment and is disposed on the array substrate at its surface contacting the liquid crystal layer LQ.

On the other hand, the countersubstrate CT is formed of a light transmissive second insulating substrate 20 such as a glass substrate. In the present embodiment, the surface (inner surface) of the second insulating substrate 20 which is opposed to the array substrate AR is a first main surface 20A and the other surface (outer surface) of the second insulating substrate 20 is a second main surface 20B. The countersubstrate CT includes a black matrix 21, color filter 22, and overcoat layer 23 which define each pixel PX at the first main surface 20A side of the second insulating substrate 20.

The black matrix 21 is disposed on the first main surface 20A of the second insulating substrate 20. The black matrix 21 defines each pixel PX in the active area and forms an aperture AP. The black matrix 21 is opposed to the interconnection part including the gate line G, source line S, and switching element SW provided with the array substrate AR.

The color filter 22 is formed in the aperture AP and extends onto the black matrix 21. The color filter 22 is composed of resin materials colored in different colors. For example, if a single pixel is composed of three subpixels of red, green, and blue, the color filter 22 is composed of three resin materials colored in red, green, and blue, respectively. Or, there is a case where a single pixel is composed of four subpixels of red, green, blue, and white for better transmissivity, and in this case, the color filter 22 is composed of resin materials colored in red, green, and blue together with a white or transparent resin material. If a white subpixel is used, a resin material functioning as a color filter may be removed therefrom. A boundary of color filters 22 of different colors is positioned on the black matrix 21.

The overcoat layer 23 covers the color filter 22. The overcoat layer 23 flattens the asperity on the surface of the black matrix 21 and the color filter 22. The overcoat layer 23 is formed of a transparent resin material. Furthermore, the overcoat layer 23 is covered with the second alignment film AL2. The second alignment film AL2 is formed of a material indicative of horizontal alignment and is disposed on the countersubstrate CT at its surface contacting the liquid crystal layer LQ.

The array substrate AR and the countersubstrate CT are arranged such that the first alignment film AL1 and the second alignment film AL2 face each other. At that time, a predetermined cell gap is formed between the array substrate AR and the countersubstrate CT by a columnar spacer formed on either one of the substrates. The array substrate AR and the countersubstrate CT are adhered together by a sealant with the cell gap formed therebetween. The liquid crystal layer LQ is formed of a liquid crystal composition containing liquid crystal molecules sealed between the first alignment film AL1 of the array substrate AR and the second alignment film AL2 of the countersubstrate CT.

First optical device OD1 including a first polarizer PL1 is disposed on the outer surface of the array substrate AR, that is, on the first main surface 10A of the first insulating substrate 10. Second optical device OD2 including a second polarizer PL2 is disposed on the outer surface of the countersubstrate CT, that is, on the second main surface 20B of the second insulating substrate 20. A first polarizing axis (first absorption axis) of the first polarizer PL1 and a second polarizing axis (second absorption axis) of the second polarizer PL2 are, for example, in a crossed-Nicol relationship in which they are orthogonal to each other.

The first alignment film AL1 and the second alignment film AL2 are subjected to an alignment treatment (such as rubbing treatment and optical alignment treatment) to have their alignment conditions parallel to each other within a plane parallel to the substrate main surfaces (X-Y plane) of the array substrate AR and the countersubstrate CT.

The first polarizing axis of the first polarizer PL1 is set to, for example, an orientation parallel to the alignment treatment direction of the first alignment film AL1. The second polarizing axis of the second polarizer PL2 is set to, for example, an orientation orthogonal to the alignment treatment direction of the first alignment film AL1.

FIG. 2 is a plan view which schematically shows the pixel PX in FIG. 1. In FIG. 2, only the components necessary for the explanation of the pixel PX are depicted, and the common electrode CE is omitted. In the example depicted, each source line S extends winding in direction Y; however, each source line S may extend linearly in direction Y. Gate line G including first electrode WG extends linearly in direction X.

The semiconductor layer SC extends and bends between first contact hole CH1 and second contact hole CH2 to cross the gate line G. In the following explanation, a region of the semiconductor layer SC opposed to the gate line G (first electrode WG) is referred to as first region R1. Two regions of the semiconductor layer SC sandwiching first region R1 are referred to as second region R2 and third region R3. Second region R2 and third region R3 correspond to impure regions containing impurities. First region R1, second region R2, and third region R3 may be referred to as channel region, source region, and drain region, respectively.

Second region R2 and third region R3 in the semiconductor layer SC are low-resistive than first region R1. Second region R2 contacts the source line S (second electrode WS) through the first contact hole CH1. Furthermore, third region R3 contacts the third electrode WD through the second contact hole CH2. The third electrode WD contacts the pixel electrode PE through the third contact hole CH3.

As in FIG. 2(a), first region R1 in the semiconductor layer SC forms a rectangular having width W in direction X and length L in direction Y. Width W and length L are defined such that the area of first region R1 is 20 $\mu m^2$ or less, for example. Now, width W is given 5 $\mu m$ and length L is given 3 $\mu m$, and in that case, the area of first region R1 is 15 $\mu m^2$. With such a small switching element SW in which the area of first region R1 is 20 $\mu m^2$ or less, the liquid crystal display device 1 of high-definition can be achieved.

The operation of the liquid crystal display device 1 having the above structure is now explained.

During an off-state in which a voltage forming a potential difference between the pixel electrode PE and the common electrode CE is not applied, a field is not formed between the pixel electrode PE and the common electrode CE. Therefore, no field works on the liquid crystal layer LQ. Therefore, the liquid crystal molecules in the liquid crystal layer LQ are initially aligned toward the alignment treatment direction of the first and second alignment films AL1 and AL2 within X-Y plane. Hereinafter, the direction in which liquid crystal molecules are in initially aligned is referred to as the initial alignment direction.

In the off-state, the light from the backlight BL partly transmits the first polarizer PL1 and is incident upon the liquid crystal display panel LPN. The light incident upon the liquid crystal display panel LPN is linear polarized light which is orthogonal to the first polarizing axis of the first polarizer PL1. The polarization of the linear polarized light does not change when passing through the liquid crystal display panel LPN in the off-state. Therefore, the linear polarized light which has passed through the liquid crystal display panel LPN is absorbed by the second polarizer PL2 which is in crossed-Nicol relationship with respect to the first polarizer PL1 (black display).

On the other hand, during an on-state in which a voltage forming a potential difference between the pixel electrode PE and the common electrode CE, a fringe field is formed between the pixel electrode PE and the common electrode CE. Therefore, a field works on the liquid crystal layer LQ, and the liquid crystal molecules are aligned in a direction different from the initial alignment direction within X-Y plane.

In this on-state, the linear polarized light which is orthogonal to the first polarizing axis of the first polarizer PL1 is incident upon the liquid crystal display panel LPN and the polarization changes depending on the alignment state of the liquid crystal molecules (or the retardation of the liquid crystal layer) when the linear polarized light passes through the liquid crystal layer LQ. Therefore, in the on-state, the light which has passed through the liquid crystal layer LQ at least partly passes through the second polarizer PL2 (white display).

Now, an example of a manufacturing method of the liquid crystal display device 1 is explained.

FIG. 3 is a flowchart which schematically shows the manufacture of the liquid crystal display device 1 step by step. Initially, the array substrate AR including components such as the undercoat layer 11, the first insulating film 12, the second insulating film 13, the third insulating film 14, the fourth insulating film 15, the switching element SW, the pixel electrode PE, the common electrode CE, and the first alignment film AL1 above the second main surface 10B of the first insulating substrate 10 is manufactured (step ST1).

On the other hand, a countersubstrate CT including the black matrix 21 which define each pixel PX, the color filter 22, the overcoat layer 23, and the second alignment film AL2 above the first main surface 20A of the second insulating substrate 20 is manufactured (step ST2). A columnar spacer may be formed at either the array substrate AR or the countersubstrate CT, or columnar spacers are formed on both the array substrate AR and the countersubstrate CT. In this example, the columnar spacer is formed when the countersubstrate CT is being formed in step ST2.

Next, a sealant used to attach the countersubstrate CT to the array substrate AR is applied to or printed on the array substrate AR or the countersubstrate CT (step ST3). The sealant may be formed on either the array substrate AR or the countersubstrate CT, and in this example, it is formed on the array substrate AR side in step ST3. The sealant is formed in, for example, a loop shape. Then, a suitable amount of liquid crystal material is dropped in the area surrounded by the sealant on the array substrate AR.

The countersubstrate CT is attached to the array substrate AR with the sealant applied thereto and the liquid crystal material dropped therein (step ST4). The liquid crystal material is spread evenly between the array substrate AR and the countersubstrate CT and sealed therein.

Note that the above method indicates that the liquid crystal material is dropped onto the array substrate AR before it is attached to the countersubstrate CT; however, no limitation is intended thereby. For example, the sealant may be formed to have a liquid crystal inlet through which the liquid crystal material is injected between the array substrate AR and the countersubstrate CT after the adhesion of these substrates.

After the adhesion, the first main surface 10A of the first insulating substrate 10 and the second main surface 20B of the second insulating substrate 20 are polished until the first insulating substrate 10 and the second insulating substrate 20 become a predetermined thickness, respectively (step ST5). In this embodiment, each of the first insulating substrate 10 and the second insulating substrate 20 is a glass substrate which is polished by chemical etching. The polish is performed by an etching process using a fluoric acid solution containing 10 or more weight % of hydrogen fluoride as an etching liquid.

The array substrate AR and the countersubstrate CT are thinned through such a polish process, and the first optical device OD1 and the second optical device OD2 are provided thereon. Furthermore, components such as driving circuits of the gate line G and the source line S are provided with the substrates, and the liquid crystal display panel LPN is prepared. Then, a backlight BL is disposed at the rear surface side of the liquid crystal display panel LPN, and a cover glass and a touch panel are disposed on the second optical device OD2, if necessary. Through the above steps, the liquid crystal display device 1 is prepared.

During such a manufacturing process, the first insulating substrate 10 may become electrostatically charged because of friction and the like between the first insulating substrate 10 and stages and conveyance mechanisms of manufacturing apparatuses used for film formation and patterning. The electrostatic charge may cause electrostatic destruction in components having capacitance such as switching elements SW.

Now, a countermeasure used to prevent such electrostatic destruction is explained. FIGS. 4 to 9 are cross-sectional views which explain step ST1 in FIG. 3 in detail, that is, the manufacturing process of the array substrate AR.

Figure 4:
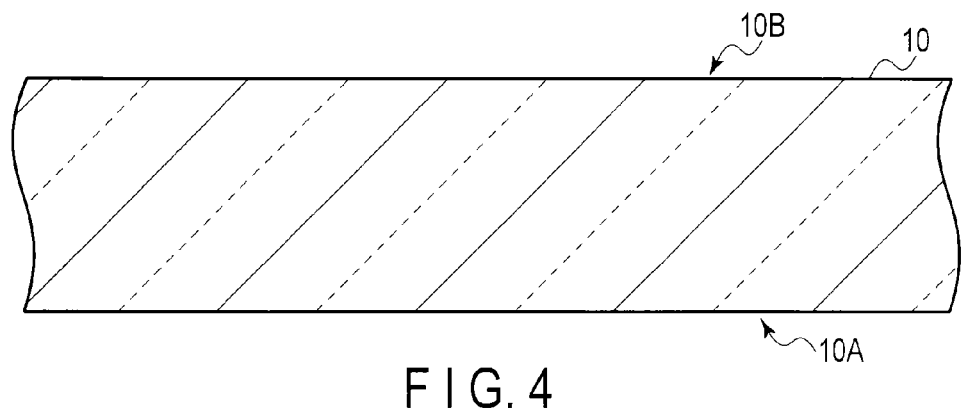
FIG. 4 is a cross-sectional view which shows a manufacturing process of the array substrate.

Initially, as shown in FIG. 4, a first insulating substrate (glass substrate) 10 whose first main surface 10A and second main surface 10B have not been subjected to any treatment is prepared.

Figure 5:
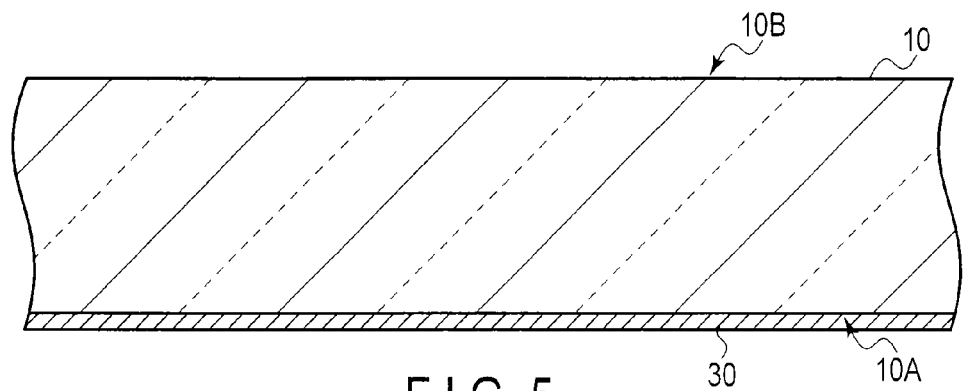
FIG. 5 is a cross-sectional view which shows a manufacturing process of the array substrate.

Then, as shown in FIG. 5, a conductive film 30 is formed on substantially the entirety of the first main surface 10A of the first insulating substrate 10. A material for the conductive film 30 can be selected from various metals, metal compounds, and light transmissive materials such as ITO. If, for example, nitride or oxide of a high-melting-point metal is used for the conductive film 30, melting and deformation of the conductive material 30 can be prevented even in a manufacturing process performed in a high-temperature environment. In general, nitride is better than oxide in conductivity. Furthermore, oxide tends to react with a gas such as hydrogen and may affect various processes in the manufacture of the array substrate AR. From these standpoints, the conductive film 30 should preferably be formed of nitride of a high-melting-point metal. Such a high-melting-point metal can be tungsten, tantalum, molybdenum, and niobium, or an alloy containing these metals. The conductive film 30 may be formed of a simple substance of such a metal or an alloy.

In the present embodiment, a material for the conductive film 30 should preferably be determined to satisfy the following conditions 1 and 2.

[Condition 1]

An etching rate of a material (first etching rate) in an etching process using a fluoric acid solution containing 10 or more, preferably 30 or more, weight % of hydrogen fluoride as an etching liquid is substantially the same or greater than that of the first insulating substrate 10 (second etching rate) in the etching process using the same solution.

[Condition 2]

An etching rate of the material (third etching rate) in an etching process using a fluoric acid solution containing 1 or less, or 2 or less, weight % of hydrogen fluoride as an etching liquid is 1 nm/sec or less.

As an example of a conductive nitride satisfying both conditions 1 and 2, tungsten nitride can be cited. The conductive film 30 of tungsten nitride can be formed on the first main surface 10A of the first insulating substrate 10 by, for example, reactive spattering. The reactive spattering is performed by, for example, preparing a vacuum chamber in which a target tungsten and a first insulating substrate 10 are disposed, heating the first insulating substrate 10 to a temperature of approximately 100° C., and introducing a reactive gas composed of 97% argon and 3% nitrogen in the chamber.

In the present embodiment, the conductive film 30 is formed thin such that it has a thickness of 200 nm or less, or 100 nm or less. In this example, the conductive film 30 has a thickness of 50 nm. The thickness is, however, varied arbitrarily depending on the concentration of the fluoric acid solution, etching rate, and degree of polish of the first insulating substrate 10.

Figure 6A:
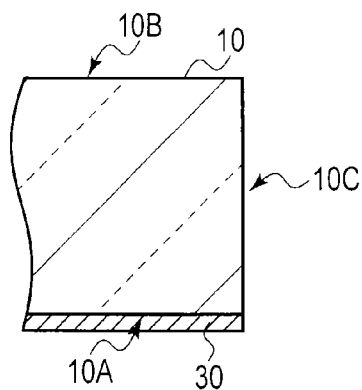
FIG. 6A is a cross-sectional view which shows an end surface of a first insulating substrate.

When the conductive film 30 is formed, the end surface 10C of the first insulating substrate 10 is masked as shown in FIG. 6(a) to avoid the conductive film 30 adhering thereto. When various treatments including patterning thereof are performed as to the first insulating substrate 10 during the manufacture of the display device, a mechanical alignment is performed to have a mechanical mechanism contact the end surface 10C for positioning of the first insulating substrate 10. In the performance of mechanical alignment, the conductive film 30 adhering to the end surface 10C would cause a gap in the positioning. Furthermore, the conducting film 30 adhering to the end surface 10C would break down into particles when the mechanical mechanism contacts thereto and particles would possibly affect subsequent processes in the manufacture of the display device. Since the conductive film 30 does not adhere to the end surface 10C, these problems can be prevented.

Figure 6B:
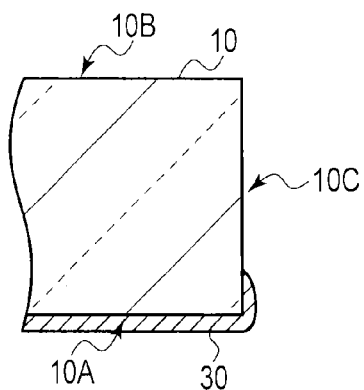
FIG. 6B is a cross-sectional view which shows an end surface of a first insulating substrate.

Note that, as in a case where an optical alignment technique is used for the positioning, if the adhesion of the conductive film 30 to the end surface 10C is acceptable, it may be allowed as shown in FIG. 6(b). If the conductive film 30 is formed by through a CVD method, the conductive film 30 tends to adhere to the end surface 10C.

After the conductive film 30 is formed, a process to form the switching element SW (switching element formation process) is initiated. That is, as shown in FIG. 7, the undercoat layer 11 is formed on the second main surface 10B side of the first insulating substrate 10, the semiconductor layer SC is formed on substantially the entirety of the undercoat layer 11, and the semiconductor layer SC is patterned into an island shape corresponding to a region in which the switching element SW is formed.

Then, the first insulating film 12 is formed on the semiconductor layer SC and the undercoat layer 11 in the island shape, a conductive film used as a material for the first electrode WG (gate line G) is formed on the first insulating film 12, and the conductive film is patterned into the first electrode WG.

Then, using the first electrode WG as a mask, impurities are injected into second region R2 and third region R3 of the semiconductor layer SC by the ion injection and the like. Second region R2 and third region R3 become lower resistive than first region R1. Then, the second insulating film 13 is formed on the first electrode WG and the first insulating film 12, and the second insulating film 13 and the first insulating film 12 are subjected to etching to form the first contact hole CH1 and the second contact hole CH2 reaching the semiconductor layer SC.

After the formation of the first contact hole CH1 and the second contact hole CH2, the semiconductor layer SC is partly exposed therethrough. A cleansing process is then started to cleanse the exposed part with a fluoric acid solution for removing an oxidation film and foreign matters on the surface of the semiconductor layer SC. The fluoric acid solution used in this cleansing process contains 1 or less weight % of hydrogen fluoride, and is sprayed to the entirety of the array substrate as shown in FIG. 7 through a cleaner nozzle. That is, the fluoric acid solution adheres on the conductive film 30. As already explained in the condition 2 section, the conductive film 30 has a very low etching rate with respect to the fluoric acid solution, namely, 1 nm/sec or less. Therefore, the conductive film 30 erodes by the fluoric acid solution in this cleansing process; however, the conductive film 30 is not removed completely and it resides on the first insulating substrate 10 with a certain film thickness. The cleansing process is, as for a polish process described later, expressed as a conductive film erosion process which erodes the conductive film 30 with a fluoric acid solution in the present application.

After the cleansing process, a conductive film used as a material for the second electrode WS (source line S) and the third electrode WD is formed to cover the second insulating film 13 and the semiconductor layer SC exposed through the contact holes CH1 and CH2. Then, the conductive film is subjected to patterning to form the second electrode WS (source line S) contacting the second region R2 of the semiconductor layer SC through the first contact hole CH1 and the third electrode WD contacting the third region R3 of the semiconductor layer SC through the second contact hole CH2 as shown in FIG. 8.

Figure 9:
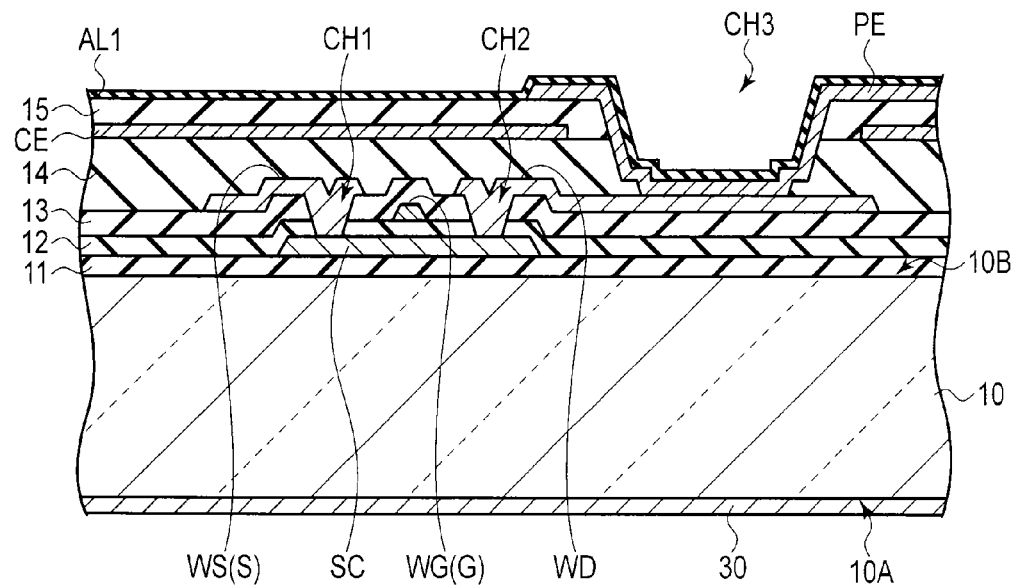
FIG. 9 is a cross-sectional view which shows a manufacturing process of the array substrate.

After the formation of the switching element SW, the third insulating film 14, the common electrode CE, and the fourth insulating film 15 are formed in this order on the second insulating film 13, the second electrode WS (source line S), and the third electrode WD as shown in FIG. 9. Note that a third contact hole CH3 passing through the third insulating film 14 and the fourth insulating film 15 is formed by forming a contact hole passing through the third insulating film 14 and a contact hole passing through the fourth insulating film 15 separately. Furthermore, the pixel electrode PE contacting the third electrode WD through the third contact hole CH3 is formed, the first alignment film AL1 is formed to cover the fourth insulating film 15 and the pixel electrode PE, and the first alignment film AL1 is subjected to the alignment treatment. At this stage, the conductive film 30 formed on the first main surface 10A of the first insulating substrate 10 still resides.

Figure 10:
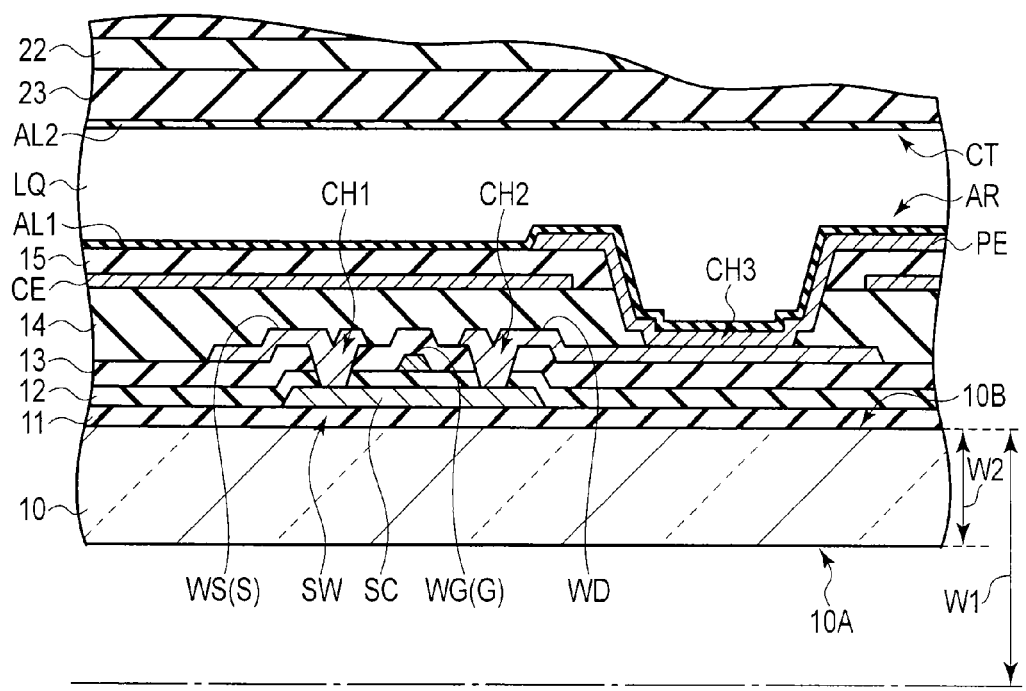
FIG. 10 is a cross-sectional view which shows a polishing process of a first insulating substrate.

The array substrate AR manufactured as above and the countersubstrate CT manufactured separately in step ST2 are attached together in step ST4. In the latter polish process in step ST5, the conductive film 30 is removed as shown in FIG. 10, and the first main surface 10A of the first insulating substrate 10 is polished chemically with a fluoric acid solution. The fluoric acid solution used in this polish process contains 10 or more weight % of hydrogen fluoride.

That is, the fluoric acid solution used in this polish erodes the conductive film 30 first, and then the conductive film 30 is removed. Then, the fluoric acid solution erodes the first main surface 10A such that the thickness of the first insulating substrate 10 changes from W1 to W2 as shown in FIG. 10. In FIG. 10, the position of the first main surface 10A before the erosion is indicated by an alternate long and short dash line. Width W1 is, for example, 1.0 mm or less. In this example, width W1 is approximately 0.5 mm, and width W2 is approximately 0.15 mm. In that case, first insulating substrate 10 is polished by approximately 0.35 mm. As to the countersubstrate CT, the second insulating substrate 20 is polished to the same extent as the first insulating substrate 10. Using the array substrate AR and the countersubstrate CT after the polish, the liquid crystal display device 1 is manufactured.

In a conventional manufacturing process of a display device, electrostatic energy is generated because of a contact, friction, and exfoliation between an insulating substrate and various manufacturing apparatuses and conveying mechanisms or of a plasma treatment such as plasma CVD. If the electrostatic charge increases locally on the insulating substrate, electrostatic destruction may occur in the switching element SW and various lines formed in the proximity of the local charge. Such electrostatic destruction tends to occur, when the second insulating film 13 is formed, between a conductive layer forming the gate line G and the first electrode WG and the semiconductor layer SC, or between lines in the electrically floating state. Contrary, in the present embodiment, a conductive film 30 is on the first main surface 10A of the first insulating substrate 10 during the formation of the switching element SW, and thus, the electrostatic energy generated in the manufacturing process can be dispersed by the conductive film 30. Consequently, a local electrostatic charge does not occur and electrostatic destruction in the switching element SW and various lines can be prevented.

Furthermore, in the present embodiment, the conductive film 30 is removed only after the formation of the switching element SW. Therefore, the conductive film 30 does not affect the display quality of the liquid crystal display device 1. Furthermore, the conductive film 30 is removed in the process of polish of the first main surface 10A of the first insulating substrate 10. Therefore, an additional process to exclusively remove the conductive film 30 is not necessary.

After the formation of the source line S, and second electrode WS and third electrode WD of the switching element SW, an electrical continuity is established between the switching element SW and the source line S and the like. Therefore, the charge between the first electrode WG and the semiconductor layer SC is dispersed and electrostatic destruction does not occur easily. Furthermore, if there is provided a short ring (guard ring) which short-circuits the source line S and the gate line G via a semiconductor layer and the like, electrostatic destruction of the switching element SW can be prevented after the formation of the short ring. The short ring is, in general, formed together with the formation of the second electrode WS and the third electrode WD. Once the short ring is formed, the conductive film 30 may be removed before the polishing process of the first insulating substrate 10.

The electrostatic destruction tends to occur more easily in the switching element SW when the area of the first region R1 in which the semiconductor layer SC and the first electrode WG are opposed to each other becomes smaller. Especially, when the area of the first region R1 is 20 $\mu m^2$ or less, the incidence of electrostatic destruction becomes significantly high. Most electrostatic destruction occurs in the manufacturing process before the formation of the short ring. Therefore, the electrostatic destruction prevention effect of the conductive film 30 in the present embodiment is further remarkable in the manufacturing process of the liquid crystal display device 1 including the switching element SW having the first region R1 with an area of 20 $\mu m^2$ or less.

Furthermore, in the present embodiment, as in condition 1 mentioned above, the first etching rate of the conductive film 30 with respect to the fluoric acid solution containing 10 or more weight % of hydrogen fluoride is substantially the same as or greater than the second etching rate of the first insulating substrate 10 with respect to the same fluoric acid solution. Therefore, even if the fluoric acid solution erodes the conductive film 30 unevenly and the first main surface 10A is partly exposed to the fluoric acid solution for a certain period of time, the thickness to be eroded of the first main surface 10A in this period of time can be suppressed and the first main surface 10A can be finished flat.

Furthermore, as in the present embodiment, with the conductive film 30 having a thickness of 200 nm or less, or 100 nm or less, the removal of the conductive film 30 can be completed in a very short time by the fluoric acid solution used in the above-described polishing process. Therefore, even if the first main surface 10A is partly exposed to the fluoric acid solution for a certain period of time, the period is significantly shorter than the polishing time of the first insulating substrate 10, and the first main surface 10A can be finished flat. For example, given that the conductive film 30 has a thickness of 100 nm, and the first insulating substrate 10 is polished by 0.35 mm, the first insulating substrate 10 is polished by approximately 3,500 times the thickness of the conductive film 30. As can be understood from this point, the period used to remove the conductive film 30 is significantly shorter than the polishing time of the first insulating substrate 10.

Furthermore, in the present embodiment, as in condition 2 mentioned above, the third etching rate of the conductive film 30 with respect to the fluoric acid solution containing 1 or less weight % of hydrogen fluoride is 1 nm/sec or less. The conductive film 30 satisfying this condition is eroded thinner in the cleansing process of the semiconductor layer SC with the fluoric acid solution but is never removed completely.

The inventors of the present application studied the incidence of electrostatic destruction of the switching elements SW in cases where display devices were manufactured each with the conductive film 30 of tungsten nitride disposed on the first main surface 10A of the first insulating substrate 10 and cases where display devices were manufacturing each without the conductive film 30. In this study, a large size glass substrate of 1500 mm×1800 mm was prepared as the first insulating substrate 10 (mother glass) in both cases, and a formation area of the array substrate AR was set to prepare three hundred display devices each including, for example, an active display area of 5 inch diagonal. The area of the first region R1 in the switching element SW of each array substrate AR was 15 $\mu m^2$. The study showed that electrostatic destruction occurred in the case of some of the switching elements SW of six out of three hundred array substrates AR manufactured without the conductive film 30, that is, the incidence of electrostatic destruction was 2%. On the other hand, no electrostatic destruction was observed in switching elements SW of three hundred array substrates AR manufactured with the conductive film 30. The results proved that the conductive film 30 performs the significant advantage of electrostatic destruction prevention.

The conductive film 30 gives a further advantage of suppressing unevenness in film thickness in each layer formed in the second main surface 10B of the array substrate AR. The advantage is now explained below.

FIG. 11 is a cross-sectional view which schematically shows a basic principle of unevenness in film thickness. In FIG. 11, a first insulating substrate 10 without a conductive film 30 disposed on a stage 100 is depicted. The stage 100 can be mounted on various manufacturing apparatuses such as etching apparatus, CVD apparatus, and spattering apparatus, and pin holes 101 are provided with multiple points. Through each pin hole 101, a pin 102 appears/disappears to raise the substrate placed on a mount surface of the stage 100 in case of, for example, moving the substrate. The stage 100 is set to a ground potential.

If a certain film is formed on the second main surface 10B of the first insulating substrate 10 on the stage 100 by, for example, CVD or the like, the potential may be disturbed at positions corresponding to pin holes 101, and the film thickness may be uneven. Therefore, when a great number of array substrate AR are manufactured using a large size first insulating substrate 10 as in the above-mentioned case, the formation area of each array substrate AR must be determined to avoid the positions of pin holes 101. In that case, a gap between the formation areas of the array substrates AR must be set greater depending on the positions of pin holes 101 accordingly. That is, the positions of pin holes 101 will limit the number of array substrates AR which can be manufactured from a single large size first insulating substrate 10.

In contrast, FIG. 12 is a cross-sectional view which schematically shows a first insulating substrate 10 with a conductive film 30 disposed on a stage 100. If the conductive film 30 is provided with the first main surface 10A of the first insulating substrate 10 as depicted, the potential at the first main surface 10A side can be maintained evenly regardless of pin holes 101. Therefore, the conductive film 30 in the present embodiment can suppress unevenness of the film thickness of each layer formed at the second main surface 10B. Consequently, the formation area of the array substrate AR can be determined without concern for the positions of pin holes 101. That is, as compared to the case in FIG. 11, the formation area of the array substrate AR can be set to positions overlapping the pin holes 101, and the impossibility of the arrangement of the formation area of the array substrate AR can be expanded. The number of the array substrates AR manufactured from a single large size first insulating substrate 10 can be increased more than that of the case in FIG. 11.

As can be understood from the above, various advantages can be achieved by the conductive film 30, and the productivity of the display device can be improved.

Furthermore, if the insulating substrates of the array substrate and the countersubstrate are required to have different film thickness in a final product, the conductive film 30 can set a difference in film thickness between the insulating substrates of the array substrate and the countersubstrate.

Note that, in the present embodiment, the manufacturing method of the liquid crystal display device 1 has been explained that the method includes a process to form the conductive film 30 on the first insulating substrate 10. However, the method is not limited thereto, and a process to form the conductive film 30 on the first insulating substrate 10 may be performed by a subject which is different from the one performing its subsequent processes in the method. That is, the first insulating substrate 10 with the conductive film 30 formed thereon can be traded independently as a substrate for display device. In that case, a conductive film 30 may not be formed on the end surface 10C of the first insulating substrate 10, or may be formed at least partly on the end surface 10C.

The structure described in the above embodiment can be varied arbitrarily. Some variations are exemplified hereinafter.

(Variation 1)

In the above embodiment, single- and top-gate switching elements SW have been given. However, the switching elements SW may be other elements such as bottom-gate thin-film transistors and double-gate thin-film transistors.

Figure 13:
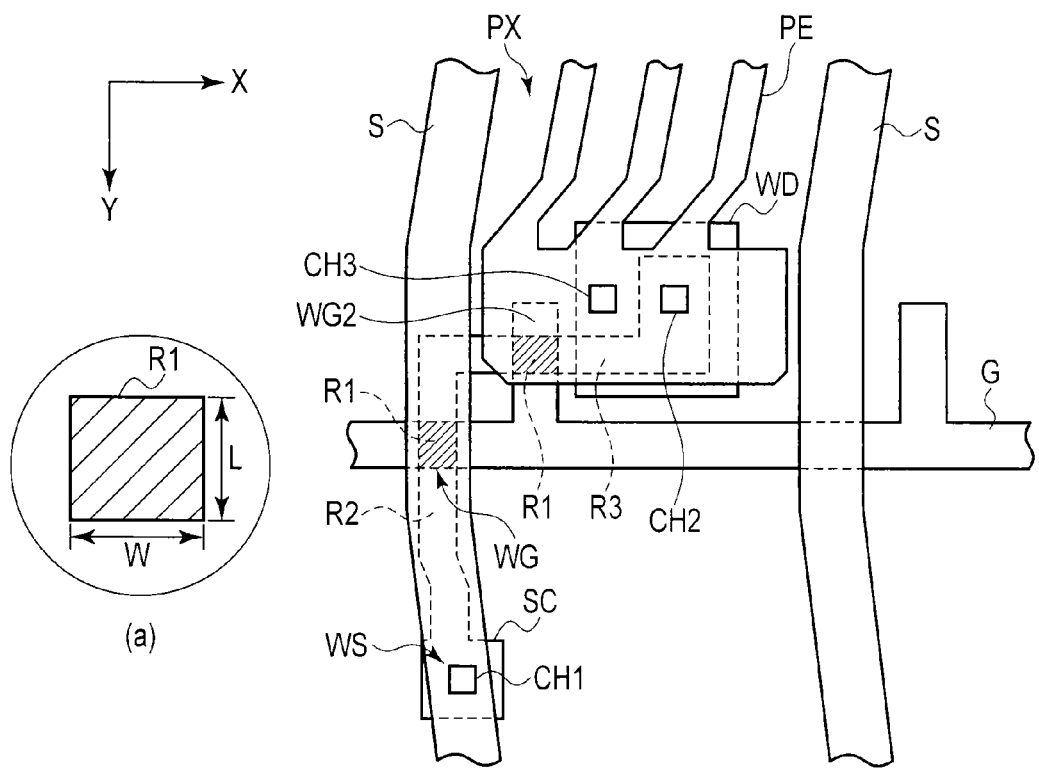
FIG. 13 shows a variation in which a double-gate switching element is used.

For example, FIG. 13 is a plan view which schematically shows a pixel PX in which a double-gate thin-film transistor is used as a switching element SW. As compared to the structure in FIG. 2, the example depicted in FIG. 13 includes a first electrode WG2 formed integrally with the gate line G in addition. The first electrode WG2 crosses a semiconductor layer SC to form a first region R1 (channel region). That is, in this example, there are two first regions R1. In the example depicted, each first region R1 has a width W of 5 µm, and a length L of 3 µm. Thus, the area of each first region R1 is 15 µm².

In such a double-gate thin-film transistor, the incidence of electrostatic destruction in the switching element SW increases significantly when at least one of the two first regions R1 has an area of 20 µm² or less. Therefore, the electrostatic destruction prevention effect of the conductive film 30 is further remarkable in the manufacturing process of the liquid crystal display device 1 when the switching element SW has at least one first region R1 whose area is 20 µm² or less.

(Variation 2)

Figure 14:
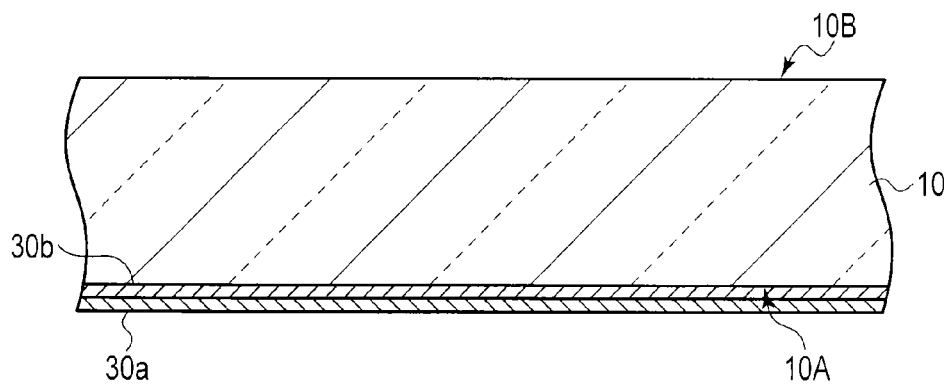
FIG. 14 shows a variation in which a plurality of conductive films are formed on a first insulating substrate.

In the above embodiment, the conductive film 30 has been given as a single layer structure. However, the conductive film 30 may be composed of a plurality of layers. For example, FIG. 14 is a cross-sectional view which shows a substrate for display device in which two conductive films 30a and 30b are formed on the first main surface 10A of the first insulating substrate 10. The conductive films 30a and 30b are formed of different materials. Materials for conductive films 30a and 30b may be various metals, metal compounds, and light transmissive materials such as ITO. Conditions for forming conductive films 30a and 30b including a film formation method and thickness may be the same as or arbitrarily changed from those used in the above embodiment.

Furthermore, in the substrate for display device, the conductive film 30a may be formed of a material to be eroded by the fluoric acid solution used in the cleansing process of the semiconductor layer SC and the conductive film 30b may be formed of a material not to be eroded by the fluoric acid solution used in the cleansing process. In that case, the conductive film 30a is removed in the cleansing process of the semiconductor layer SC while the conductive film 30b remains. Furthermore, if the conductive film 30b is formed of a material to be eroded by acid solution containing oxalate or the like which is used in a cleansing process before the formation of the pixel electrode PE, the conductive film 30b can be removed in this cleansing process.

In addition to the above, structures with arbitral design changes added by a person having ordinary skill in the art based on the structures which have been described in the above-described embodiment and variations are, as long as they fall within the scope and spirit of the present invention, encompassed by the scope of the present invention.

Furthermore, regarding the above-described embodiment and variations, any additional advantage and effect which are obvious from the description of the specification or arbitrarily conceived by a skilled person are considered naturally achievable by the present invention.

Note that, the liquid crystal display panel LPN may be structured such that a common electrode is provided with a countersubstrate to generate a field between a pixel electrode of an array substrate and the common electrode of the countersubstrate and liquid crystals are driven by the field.

Furthermore, in the example of FIG. 1, the explanation has been provided referring to the liquid crystal display device which comprises a light transmissive liquid crystal display panel and selectively transmits light radiated from the backlight to display images. However, the present embodiment can be applied to a liquid crystal display device which comprises a reflective liquid crystal display panel and selectively reflects external light incident from a counter-substrate side to display images, or a transflective liquid crystal display device which comprises both transmissive and reflective display functions.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A manufacturing method of a display device, comprising:
   forming a switching element above a second main surface of an insulating substrate, the insulating substrate having a first main surface on which a conductive film formed of nitride of a high-melting-point metal is formed, the second main surface facing the first main surface; and
   eroding the insulating substrate and the conductive film formed on the first main surface of the insulating substrate on which the switching element is formed, wherein
   the eroding comprises a cleansing process and a polishing process,
   in the polishing process, the conductive film formed on the first main surface of the insulating substrate is removed and the first main surface of the insulating substrate is polished, and
   a fluoric acid solution containing 10% or more of hydrogen fluoride is used in the polishing process, and a first etching rate of the conductive film in the polishing process is substantially equal to a second etching rate of the insulating substrate in the polishing process, or the first etching rate is greater than the second etching rate.

2. The manufacturing method of claim 1, wherein the forming of the switching element includes:
   forming a semiconductor layer above the second main surface of the insulating substrate and a first electrode opposed to the semiconductor layer with an insulating film interposed therebetween; and
   forming a second electrode and a third electrode electrically connected to a second region and a third region of the semiconductor layer, respectively, between which a first region of the semiconductor layer opposed to the first electrode is disposed, and
   the first region has an area of 20 $\mu m^2$ or less.

3. The manufacturing method of claim 1, wherein
   a fluoric acid solution containing 2% or less of hydrogen fluoride is used in the cleansing process,
   a third etching rate of the conductive film in the cleansing process is 1 nm/sec or less, and
   the conductive film is not completely removed by the cleansing process.

4. The manufacturing method of claim 1, wherein
   the cleansing process is conducted during the forming of the switching element, and
   the polishing process is conducted after the forming of the switching element.

5. A manufacturing method of a display device, comprising
   forming a switching element above a second main surface of an insulating substrate, the insulating substrate having a first main surface on which a conductive film formed of nitride of a high-melting-point metal is formed, the second main surface facing the first main surface; and
   eroding the insulating substrate and the conductive film formed on the first main surface of the insulating substrate on which the switching element is formed, wherein
   the eroding comprises a cleansing process and a polishing process,
   in the polishing process, the conductive film formed on the first main surface of the insulating substrate is removed and the first main surface of the insulating substrate is polished, and
   a fluoric acid solution containing 30% or more of hydrogen fluoride is used in the polishing process, and a first etching rate of the conductive film in the polishing process is substantially equal to a second etching rate of the insulating substrate in the polishing process, or the first etching rate is greater than the second etching rate.

6. The manufacturing method of claim 5, wherein the conductive film is tungsten nitride.

7. The manufacturing method of claim 5, wherein
   a fluoric acid solution containing 2% or less of hydrogen fluoride is used in the cleansing process,
   a third etching rate of the conductive film in the cleansing process is 1 nm/sec or less, and
   the conductive film is not completely removed by the cleansing process.

8. The manufacturing method of claim 5, wherein the forming of the switching element includes:
   forming a semiconductor layer above the second main surface of the insulating substrate and a first electrode opposed to the semiconductor layer with an insulating film interposed therebetween; and
   forming a second electrode and a third electrode electrically connected to a second region and a third region of the semiconductor layer, respectively, between which a first region of the semiconductor layer opposed to the first electrode is disposed, and
   the first region has an area of 20 $\mu m^2$ or less.

9. The manufacturing method of claim 5, wherein
   the cleansing process is conducted during the forming of the switching element, and
   the polishing process is conducted after the forming of the switching element.

* * * * *